US006865085B1

(12) United States Patent
Ferris et al.

(10) Patent No.: US 6,865,085 B1
(45) Date of Patent: Mar. 8, 2005

(54) HEAT DISSIPATION FOR ELECTRONIC ENCLOSURES

(75) Inventors: Matthew D. Ferris, Carver, MN (US); Cyle D. Petersen, Belle Plaine, MN (US)

(73) Assignee: ADC DSL Systems, Inc., Eden Prairie, MN (US)

( * ) Notice: Subject to any disclaimer, the term of this patent is extended or adjusted under 35 U.S.C. 154(b) by 0 days.

(21) Appl. No.: 10/673,357

(22) Filed: Sep. 26, 2003

(51) Int. Cl.[7] .............................................. H05K 7/20
(52) U.S. Cl. ..................... 361/721; 361/704; 165/80.3; 165/185
(58) Field of Search ................................ 361/704, 707, 361/717–721, 679, 687, 688; 165/80.3, 185; 174/16.1, 16.3, 50.51

(56) References Cited

U.S. PATENT DOCUMENTS

| | | |
|---|---|---|
| 2,737,579 A | 3/1956 | Wehrlin et al. |
| 2,796,559 A | 6/1957 | Feucht |
| 2,833,966 A | 5/1958 | Goodier et al. |
| 2,876,277 A | 3/1959 | Badger et al. |
| 3,087,095 A | 4/1963 | McConkey, Jr. et al. |
| 3,135,321 A | 6/1964 | Butt et al. |
| 3,366,171 A | 1/1968 | Sharli |
| 3,467,891 A | 9/1969 | Mogle |
| 3,487,267 A | 12/1969 | Winston et al. |
| 3,697,929 A | 10/1972 | Konewko et al. |
| 3,767,974 A | 10/1973 | Donovan, Jr. et al. |
| 3,809,798 A | 5/1974 | Simon |
| 3,997,819 A | 12/1976 | Eggert et al. |
| 4,172,212 A | 10/1979 | Heinzer |
| 4,184,539 A | 1/1980 | Rein |
| 4,259,843 A | 4/1981 | Kausch |
| 4,301,494 A | 11/1981 | Jordan |

(List continued on next page.)

FOREIGN PATENT DOCUMENTS

| | | |
|---|---|---|
| EP | 1 041 002 A2 | 10/2000 |
| GB | 2 193 552 | 2/1988 |
| JP | 56-93634 | 6/1981 |
| JP | 58-105187 | 7/1983 |
| JP | 60 79834 | 5/1985 |
| JP | 62-26936 | 2/1987 |
| JP | 62-67936 | 3/1987 |
| JP | 62-79404 | 4/1987 |
| JP | 2-4287 | 1/1990 |
| JP | 2-166798 | 6/1990 |
| JP | 7-177645 | 7/1995 |
| JP | 8-65868 | 3/1996 |
| JP | 02001085879 | 3/2001 |

OTHER PUBLICATIONS

Su, "Case for Mounting Slidably a Data Storage Medium in a Computer Housing" US Patent Publication No. US 2002/0141153 A1, Filed Jul. 9, 2001, Published Oct. 3, 2002. (9 pgs.).

(List continued on next page.)

*Primary Examiner*—Boris Chervinsky
(74) *Attorney, Agent, or Firm*—Fogg and Associates, LLC; Laura A. Ryan

(57) ABSTRACT

An electronics enclosure is provided. The enclosure includes a cylindrical body, one or more modular card cages adapted to receive one or more electronic circuit cards. The one or more modular card cages including an outer frame member in direct physical and thermal contact with an inner wall of the cylindrical body, an inner frame member, one or more support members coupled between the outer frame member and the inner frame member, and a plurality of electronic device retainers adapted to couple to the modular card cage and hold each of the one or more electronic circuit cards in direct physical and thermal contact with one of the one or more support members. The support members provide an isolated heat dissipation path for heat, produced by each of the one or more electronic circuit cards, to be removed from the enclosure.

54 Claims, 10 Drawing Sheets

U.S. PATENT DOCUMENTS

| | | |
|---|---|---|
| 4,449,576 A | 5/1984 | Baum et al. |
| 4,528,615 A | 7/1985 | Perry |
| 4,547,833 A | 10/1985 | Sharp |
| 4,559,790 A | 12/1985 | Houston |
| 4,564,061 A | 1/1986 | Rauth et al. |
| 4,656,559 A | 4/1987 | Fathi |
| 4,662,002 A | 4/1987 | Davis et al. |
| 4,679,250 A | 7/1987 | Davis et al. |
| 4,777,561 A | 10/1988 | Murphy et al. |
| 4,805,482 A | 2/1989 | Boda |
| 4,815,913 A | 3/1989 | Hata et al. |
| 4,849,858 A | 7/1989 | Grapes et al. |
| 4,858,068 A | 8/1989 | Bitller et al. |
| 4,858,070 A | 8/1989 | Buron et al. |
| 4,953,058 A | 8/1990 | Harris |
| 4,962,444 A | 10/1990 | Niggemann |
| 4,962,445 A | 10/1990 | Pelet et al. |
| 4,987,978 A | 1/1991 | Jungersen |
| 5,019,939 A | 5/1991 | Reimer |
| 5,045,971 A | 9/1991 | Ono et al. |
| 5,048,793 A | 9/1991 | Mefford et al. |
| 5,060,115 A * | 10/1991 | Sewell .................. 361/710 |
| 5,089,935 A | 2/1992 | Ito |
| 5,105,337 A | 4/1992 | Bitller et al. |
| 5,251,099 A * | 10/1993 | Goss et al. ............... 361/721 |
| 5,267,122 A | 11/1993 | Glover et al. |
| 5,309,315 A | 5/1994 | Naedel et al. |
| 5,329,425 A | 7/1994 | Leyssens et al. |
| 5,424,916 A | 6/1995 | Martin |
| 5,432,682 A | 7/1995 | Giehl et al. |
| 5,519,573 A | 5/1996 | Cobb et al. |
| 5,621,617 A * | 4/1997 | Goss et al. ............... 361/721 |
| 5,642,264 A | 6/1997 | Cantrell |
| 5,825,107 A * | 10/1998 | Johnson et al. ............ 310/64 |
| 5,825,621 A | 10/1998 | Giannatto et al. |
| 5,842,514 A | 12/1998 | Zapach et al. |
| 5,896,268 A | 4/1999 | Beavers |
| 5,946,193 A | 8/1999 | Hendrix et al. |
| 5,995,378 A | 11/1999 | Farnworth et al. |
| 6,002,588 A | 12/1999 | Vos et al. |
| 6,038,129 A | 3/2000 | Falaki et al. |
| 6,045,140 A | 4/2000 | Morris, Jr. |
| 6,104,611 A | 8/2000 | Glover et al. |
| 6,118,662 A | 9/2000 | Hutchinson et al. |
| 6,209,631 B1 | 4/2001 | Garsia-Ortiz |
| 6,289,678 B1 | 9/2001 | Pandolfi |
| 6,292,556 B1 | 9/2001 | Laetsch |
| 6,295,208 B1 | 9/2001 | Murchison et al. |
| 6,310,772 B1 | 10/2001 | Hutchison et al. |
| 6,366,464 B1 * | 4/2002 | Cosley et al. ............ 361/752 |
| 6,381,146 B1 | 4/2002 | Sevier |
| 6,396,691 B1 | 5/2002 | Pagnozzi |
| 6,404,637 B2 | 6/2002 | Hutchinson et al. |
| 6,406,312 B1 | 6/2002 | Heitkamp |
| 6,430,044 B2 | 8/2002 | Hutchinson et al. |
| 6,493,236 B1 | 12/2002 | Momiyama et al. |
| 6,510,223 B2 | 1/2003 | Laetsch |
| 6,535,603 B2 | 3/2003 | Laetsch |
| 6,587,339 B1 | 7/2003 | Daniels et al. |
| 6,611,426 B2 | 8/2003 | Hutchinson et al. |
| 6,665,182 B2 * | 12/2003 | Hogerl .................... 361/695 |

OTHER PUBLICATIONS

Song, HK et al., Efficient Black–Blood Carotid Artery Imaging, Procedures of the International Society of Magnetic Resonance in Medicine, 2001, p. 1963.

Song HK et al., Multislice Double Inversion Pulse Sequence For Efficient Black–Blood MRI. Magnetic Resononance in Medicine, Mar. 2002; pp. 616–620, vol. 47.

Abacon Telecommunications, HDSL Low Capacity Repeater Case, 1 pg., date unknown.

Abacon Telecommunications, HDSL High Capacity Repeater Case, 2 pgs., date unknown.

Circa Enterprises, Inc. "Digital Repeater Housings—HDSL Repeater", 2 pgs., 2000.

Circa Enterprises, Inc. "Digital Repeater Housings—T1 Repeater", 2 pgs., 2000.

Seri Lee, "How to Select a Heat Sink," Electronics Cooling, 9 pgs., Oct. 6, 2000.

"Hardened Telecom Enclosures for Optimal Thermal Management of Electronics", SPC TelEquip, pp. 1–20, Date Unknown.

Joe Ricke Sr., "Managing Heat in Electronic Enclosures," Electronic Packaging & Production, pp. 87–88, 90, 92, vol. 36, No. 2, Feb. 1996.

Gary Gustine et al., U.S. Appl. No. 09/804,129, filed Mar. 12, 2001.

Gary Gustine et al., U.S. Appl. No. 09/918,989, filed Jul. 31, 2001.

Gary Gustine et al., U.S. Appl. No. 09/919,006, filed Jul. 31, 2001.

Michael Sawyer et al., U.S. Appl. No. 10/155,050, filed May 24, 2002.

Michael Sawyer et al., U.S. Appl. No. 10/189,369, filed Jul. 2, 2002.

Michael K. Barth et al, U.S. Appl. No. 10/289,132, filed Nov. 5, 2002.

* cited by examiner

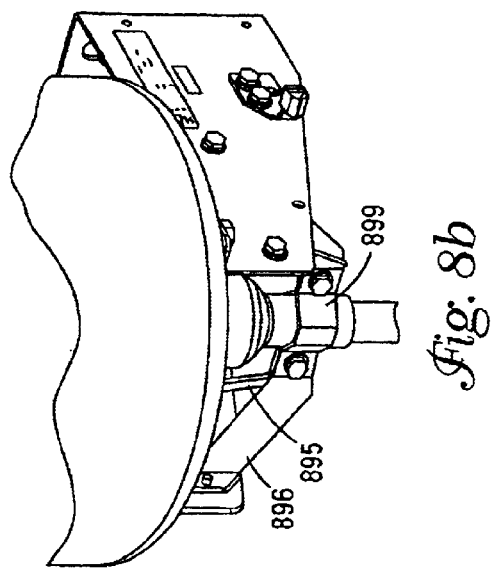
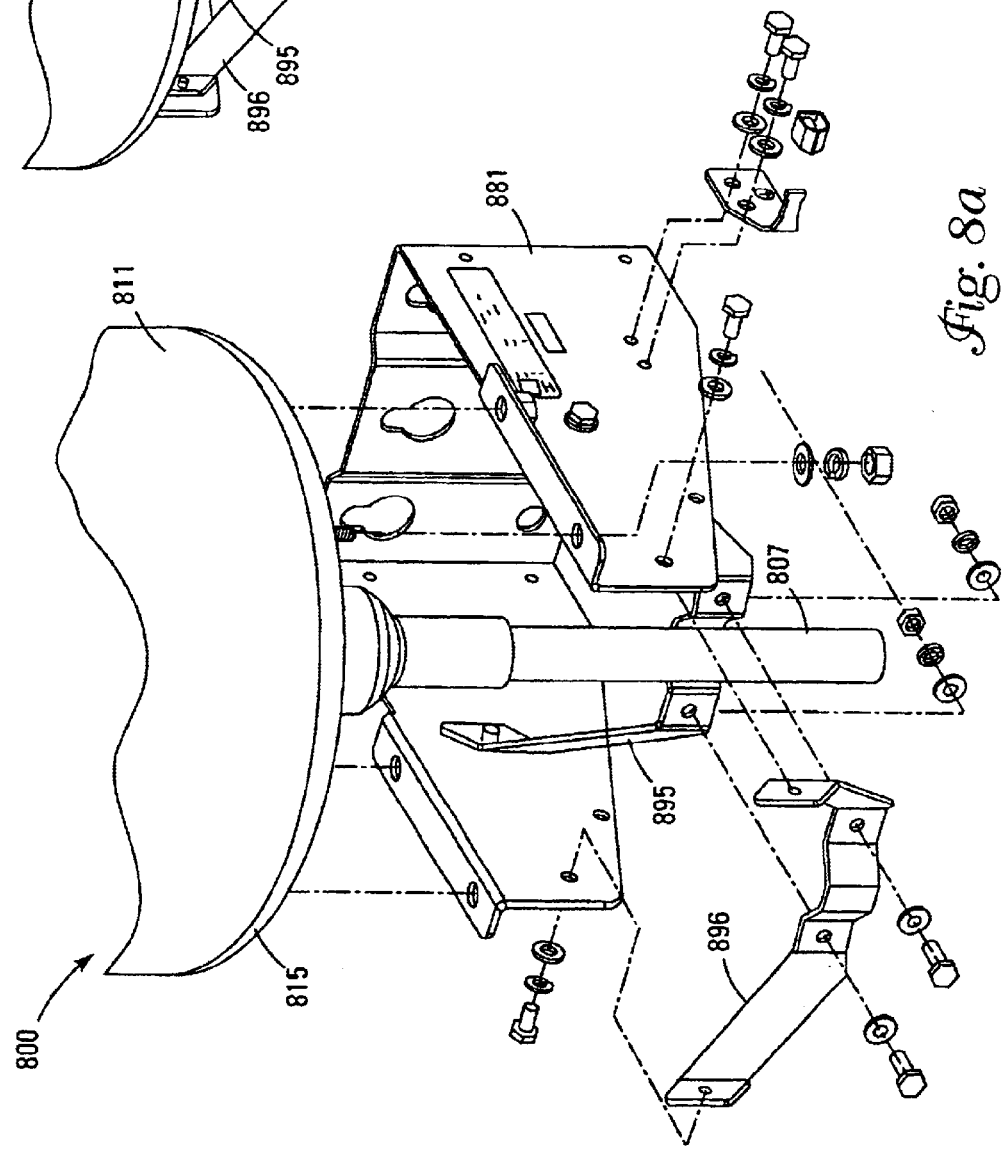

HEAT DISSIPATION FOR ELECTRONIC ENCLOSURES

CROSS REFERENCE TO RELATED APPLICATION

This application is related to co-pending application Ser. No. 10/289,132, filed on Nov. 5, 2002 and entitled METHODS AND SYSTEMS OF HEAT TRANSFER FOR ELECTRONIC ENCLOSURES (the '132 application). The '132 application is incorporated herein by reference.

TECHNICAL FIELD

The present invention relates to electronic equipment enclosures such as telecommunications repeater housings. More particularly, the invention relates to methods and systems of improved heat dissipation for electronic enclosures.

BACKGROUND

Electronic cards such as telecommunications repeaters and other electronic equipment are often housed in enclosures that are required to bear the elements above ground or below ground. The elements include but are not limited to ground water, sun, rain, salt fog, pollution, heat, cold, as well as fire. Often the underground installations are subjected to partial or total submersion in water and are required to be sealed against a pressure differential. These sealed enclosures are also required to remove energy, usually in the form of heat, generated by the electronic equipment in the enclosures. Many enclosures trap heat generated by the electronics. The build up of heat within these enclosures can cause significant problems for the electronic equipment by challenging the temperature limits of the electronic devices and causing device failure.

The enclosures are designed in a variety of configurations. One design for an electronics enclosure is substantially cylindrical. In some instances, electronics cards mounted within the cylindrical enclosure are oriented tangential to the outer wall. In some designs the cards are mounted such that two cards are stacked together, having an outer card in indirect thermal contact with the enclosure and an inner card parallel to the outer card that may be thermally connected to the outer card.

Many problems have arisen with respect to heat build up within these enclosures. The inner cards run hotter than the outer cards and as a result failure rates are higher for the inner cards. The path from the inner cards to the exterior of the enclosure is significantly longer than the outer cards. Good heat dissipation requires consistent and preferably direct contact between transfer materials e.g. the electronics card, card cages, and housing.

In some designs a card cage is used to contain the electronics cards. Often enclosures include card cages that collect and release heat into the enclosure environment and the heat becomes trapped. These card cages are typically single structures that continually exchange heat between the cards and the air within the enclosures without substantially moving the heat to the exterior of the enclosure. Because the card cage is one structure the structure becomes saturated with energy and can increase the heat build up within the enclosure.

Some applications provide a series of materials through which heat is transferred from the electronics devices to the ambient air. For example some electronic enclosures transfer heat from multiple electronic cards to a single card cage to a conductive liner to one or more heat sinks to an enclosure.

It is difficult to get and keep the electronics cards in contact with the card cage. If good contact is not maintained poor heat dissipation results and the rate of failure for the electronic devices is high. Some enclosures include active devices such as cams that require a technician or user to engage the device. The active devices force the electronic cards and card cage into contact but are prone to failure and are often overlooked by technicians and not engaged. Additionally, electronic cards come in many different styles and contact with heat transfer members do not take into consideration open frame repeaters where the repeaters are encased in a box or frame with a portion of the sides removed.

Electronics cards are also susceptible to vibration and gravity. Cards are often retained in an enclosure only by an electrical connection such as insertion into an electrical socket. Due to vibration during shipping and operation the cards can become loose and dislodged from the electrical connectors. The cards can also be loosened when subjected to mounting locations that force the electronic cards to "hang" from the electrical socket. The use of active retention devices, such as cams, requires human intervention and is not reliable. Loose connections cause operation errors and result in time consuming and costly service calls.

Often connector blocks are supposed to receive an electronics card in a specific orientation and problems arise when the card is able to be plugged into the connector block in reverse.

Electronic equipment enclosures such as repeater housings are often heavy and cumbersome. The enclosures are difficult to carry and maneuver in small places such as mounting on telephone poles or into manhole compartments. Any enclosure which exceeds a set weight is required to be equipped with a lifting mechanism for attaching hoisting cables or chains. Often enclosures are lifted using cable with bundled wires that has been potted into the bottom of the enclosure. The stress caused by the weight of the enclosure can lead to pull out of the potted cable.

In addition, enclosures are subjected to costly replacement when the heat sinks or other exterior components are deteriorated by corrosion or otherwise damaged. Complete replacement is costly and time consuming often causing a drop in service for subscribers. In particular, when assembled welding locations are susceptible to faster corrosion rates.

For the reasons stated above, and for other reasons stated below which will become apparent to those skilled in the art upon reading and understanding the present specification, there is a need in the art for an improved enclosure for electronics equipment that overcomes the above noted imitations.

SUMMARY

The above-mentioned problems with enclosures for electronics equipment and other problems are addressed by embodiments of the present invention and will be understood by reading and studying the following specification.

One embodiment provides an electronics enclosure. The enclosure includes a cylindrical body, one or more modular card cages adapted to receive one or more electronic circuit cards. The one or more modular card cages including an outer frame member in direct physical and thermal contact with an inner wall of the cylindrical body, an inner frame member, one or more support members coupled between the outer frame member and the inner frame member, and a plurality of electronic device retainers adapted to couple to the modular card cage and hold each of the one or more electronic circuit cards in direct physical and thermal contact with one of the one or more support members. The support members provide an isolated heat dissipation path for heat, produced by each of the one or more electronic circuit cards, to be removed from the enclosure.

One embodiment provides another electronics enclosure. The electronics enclosure includes a cylindrical body and one or more modular card cages adapted to receive one or more electronic circuit cards. The one or more modular card cages including an outer frame member in direct physical and thermal contact with an inner wall of the cylindrical body, an inner frame member, one or more support members coupled between the outer frame member and the inner frame member, and a plurality of electronic device retainers adapted to couple to the modular card cage and hold each of the one or more electronic circuit cards in direct physical and thermal contact with one of the one or more support members. The support members provide an isolated heat dissipation path for heat, produced by each of the one or more electronic circuit cards, to be removed from the enclosure. The enclosure further includes a printed circuit board adapted to couple to each of the one or more modular card cages. Each printed circuit board includes one or more connector blocks and a single champ connector and the one or more connector blocks are each adapted to receive one of the one or more electronic circuit cards.

One embodiment provides a repeater housing. The repeater housing includes a plurality of modular card cages adapted to couple with one or more repeaters. Each modular card cage includes a curved outer frame member, a curved inner frame member, one or more wedged support members coupled between the outer frame member and the inner frame member and one or more electronic device retainers adapted to couple to the modular card cage and form a slot to receive and hold the one or more repeaters in direct physical and thermal contact with the one or more wedged support members. The modular card cage is fabricated of a thermally conductive material. Energy produced by the one or more repeaters is directed out of the repeater housing via isolated heat dissipation paths created by the plurality of modular card cages.

One embodiment provides a method of extracting heat from a sealed electronics equipment enclosure. The method includes moving energy produced by one or more electronic cards, enclosed within the electronics equipment enclosure, to the exterior of the enclosure via a modular card cage. The modular card cage is comprised of a plurality of support members and the one or more electronics cards are each in contact with one of the plurality of support members. The method further includes dissipating the energy to air ambient to the electronics equipment enclosure via the modular card cage.

Another embodiment provides a method of creating an isolated heat dissipation path. The method includes thermally contacting one or more electronic circuit cards with a wedged support member of a modular card cage. The modular card cage includes a curved outer member coupled to a curved inner member via the wedged support member. The wedged support member is substantially perpendicular to both the inner and outer curved members. The method further includes encasing the modular card cage within an electronics enclosure, forcing the modular card cage into thermal and physical contact with an inner wall of the electronics enclosure, and drawing energy from the one or more electronic cards to the exterior of the electronics enclosure via the modular card cage.

BRIEF DESCRIPTION OF THE DRAWINGS

FIG. 8a is an illustration of one embodiment of a strain relief for an electronics enclosure according to the present invention.

FIG. 8b is an illustration of one embodiment of an assembled strain relief according to the present invention.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Embodiments of the present invention provide improvements in heat dissipation for electronic equipment enclosures such as telecommunications repeater housings. The present invention provides efficient systems and methods of removing heat from electronic equipment enclosures. Embodiments of the present invention provide isolated heat dissipation paths for electronics equipment within the electronics enclosure.

An electronics enclosure is provided. The enclosure includes a modular card cage adapted to receive one or more electronic circuit cards and come in direct contact with a wall of the enclosure. The modular card cage provides an isolated heat dissipation path for heat, produced by each of the one or more electronic circuit cards, to be removed from the enclosure.

Figure 1:
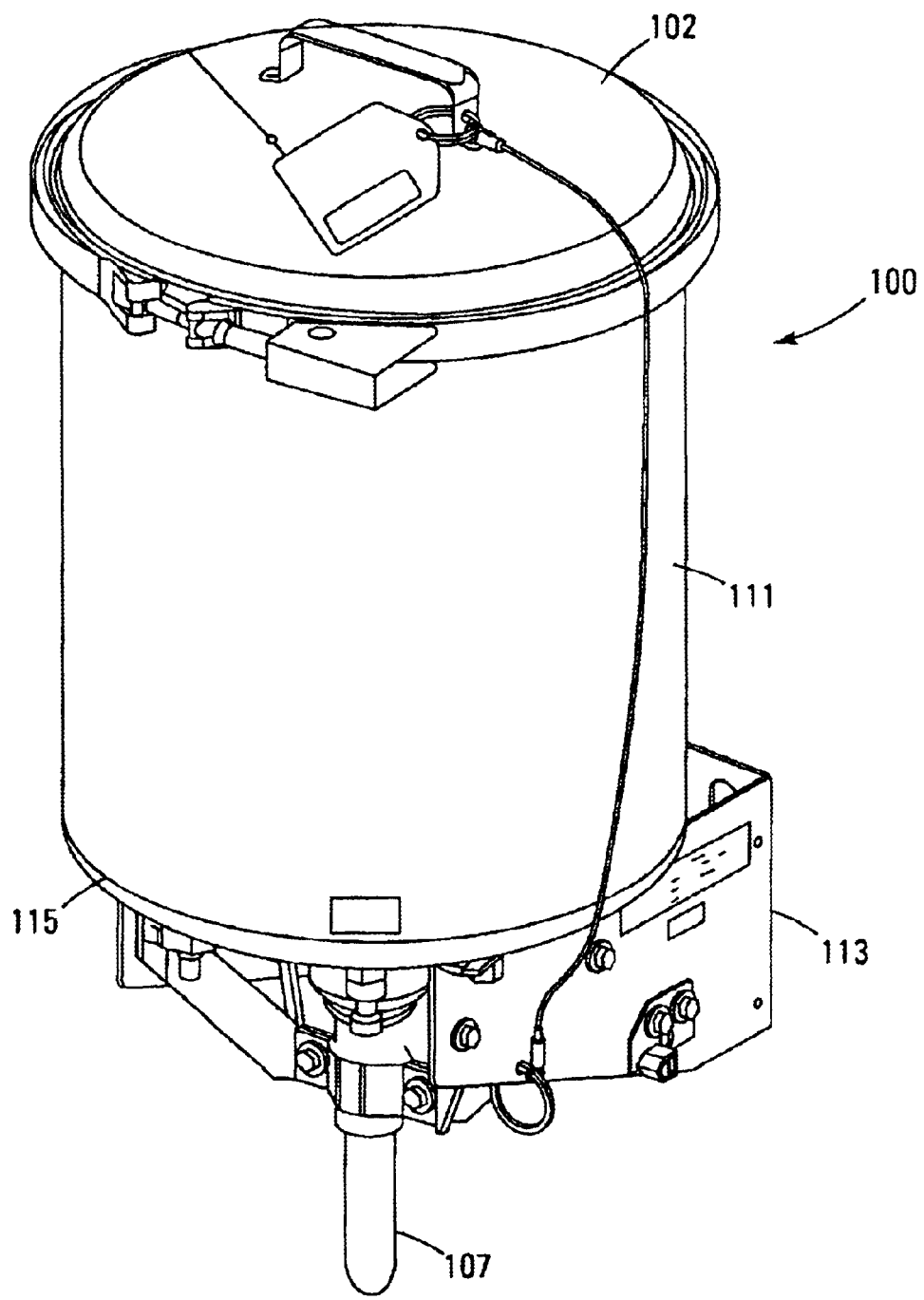
FIG. 1 is an illustration of one embodiment of an electronic equipment enclosure according to the teachings of the present invention.

FIG. 1 is an illustration of one embodiment of an electronic equipment enclosure, indicated generally at 100, according to the teachings of the present invention. In one embodiment, enclosure 100 is a telecommunications repeater housing. In one embodiment, housing 100 includes cylindrical body 111 having a lid 102 and base 115. The base 115 is adapted to couple to a mounting bracket 113. The enclosure 100 is further adapted to receive cable 107.

In one embodiment, electronic equipment enclosure 100 including body 111, base 115, lid 102 and mounting bracket are manufactured of thermally conductive materials. In one embodiment, the materials are stainless steel, aluminum, copper or the like.

Electronic cards such as telecommunications repeaters and other electronic equipment are often housed in enclosures such as electronic equipment enclosure 100 and are required to bear the elements such as ground water, sun, rain, salt fog, pollution, heat, cold, as well as fire. Telecommunications equipment enclosures are often required to be sealed against a pressure differential. These sealed enclosures are also required to dissipate energy generated by the electronic cards. Many enclosures trap heat generated by the electronics. The build up of heat within these enclosures can cause significant problems for the electronic equipment by pushing the temperature limits of the electronic devices and causing device failure.

Housing 100 provides an enclosure for electronic cards and protects them from the environment, e.g. water, heat, sun, salt fog, temperature extremes and the like. In one embodiment, housing 100 is sealed against a pressure differential.

Figure 2:
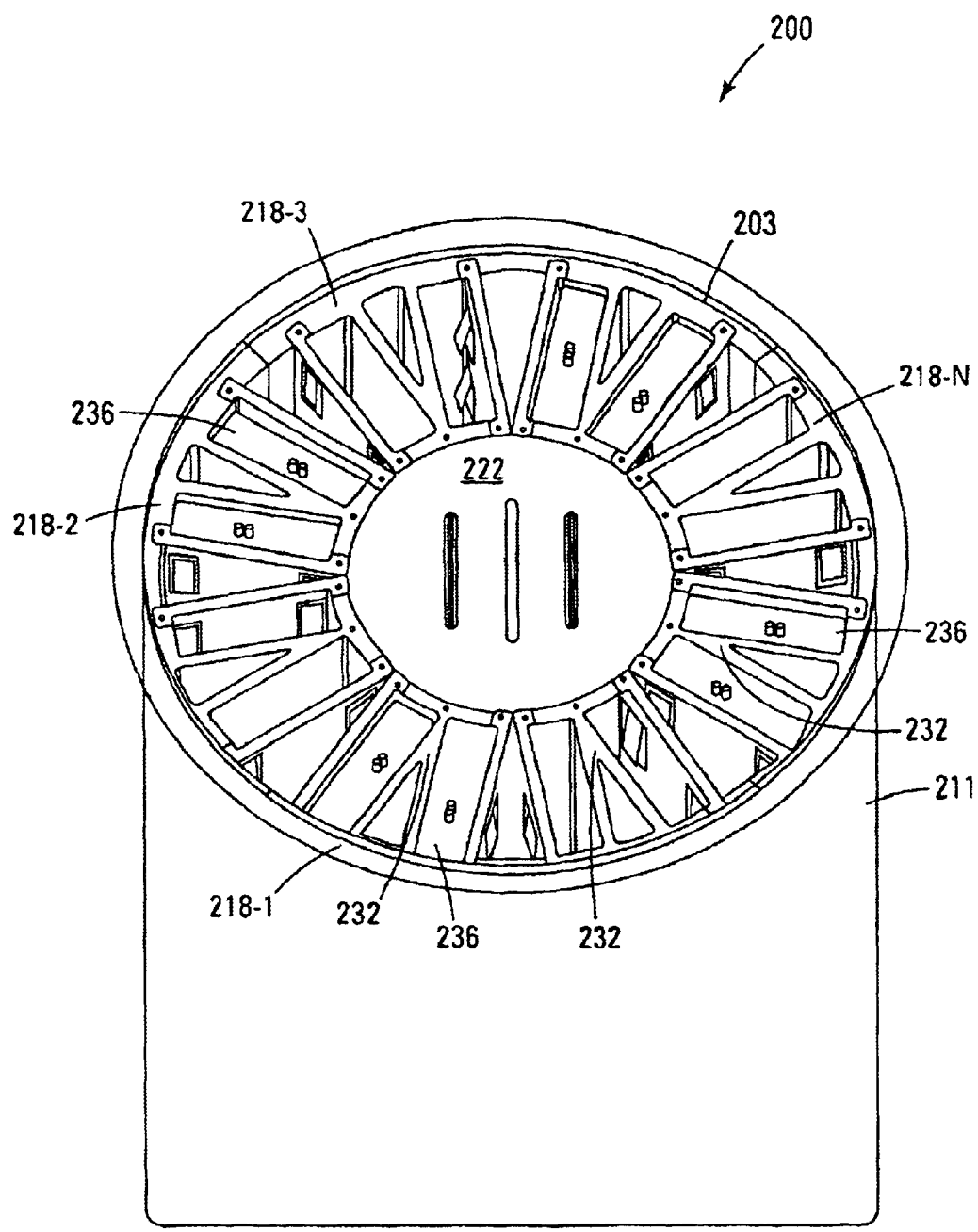
FIG. 2 is an illustration of another embodiment of an electronic equipment enclosure according to the teachings of the present invention.

FIG. 2 is an illustration of one embodiment of an electronic equipment enclosure, shown generally at 200, according to the teachings of the present invention. Electronic equipment enclosure 200 includes a cylindrical body 211 that encases a plurality of modular card cages 218-1 to 218-N. In one embodiment, cylindrical body 211 encases up to four card cages 218 and each card cage 218 has been molded, extruded, or the like from a thermally conductive material such as aluminum. In one embodiment, the extrusion is through an aluminum die. In another embodiment, modular card cages 218 are machined. In alternate embodiments, card cage 218 may be a single structure or multiple structures to form a cylindrical shape.

Enclosure 200 further includes a spacer 222 that is adapted to attach to each card cage 218 and aids in keeping each card cage 218 in direct contact with an inner wall 203 of cylindrical body 211 by forcing the card cages 218 outward toward inner wall 203. Embodiments of the present invention provide multiple modular card cages, such as card cages 218 that are independent structures and provide isolated heat dissipation paths for electronic circuit cards such as repeaters. In one embodiment, each modular card cage 218-1 to 218-N is identical and they fit together to form a hollow cylindrical card cage adapted to contain electronics equipment and are in direct contact with an inner wall 203 of cylindrical body 211. In one embodiment, the electronics equipment includes single wide and double wide repeaters for T-1, ISDN, DDS, HDSL and the like. In other embodiments, the electronics equipment are comprised of any number of electronics devices or cards.

In one embodiment, enclosure 200 is adapted to retain up to 16 single wide repeaters 236, up to 8 double wide repeaters, or a combination thereof. As shown in FIG. 2, enclosure 200 contains eight single wide repeaters 236. Each repeater 236 has an equal heat dissipation path to the exterior of enclosure 200.

In one embodiment, cylindrical body 211 is made of a substantially thermally conductive material. In one embodiment, the material is also substantially non-corrosive such as stainless steel or the like.

Isolated heat dissipation paths reduce electronic card device failure, due to heat build up, by providing a direct path to remove heat from an equipment enclosure such as enclosure 200. Embodiments of the present invention provide substantially equal heat dissipation paths for each of the electronic cards or repeaters 236 in the enclosure 200. Each electronic card 236 is in direct thermal contact with a support member 232 of a modular card cage 218 and each modular card cage is in direct thermal contact with an inner wall 203 of cylindrical body 211. As a result each electronic card 236 has a substantially equal heat dissipation path to the exterior of enclosure 200.

Figure 3A:
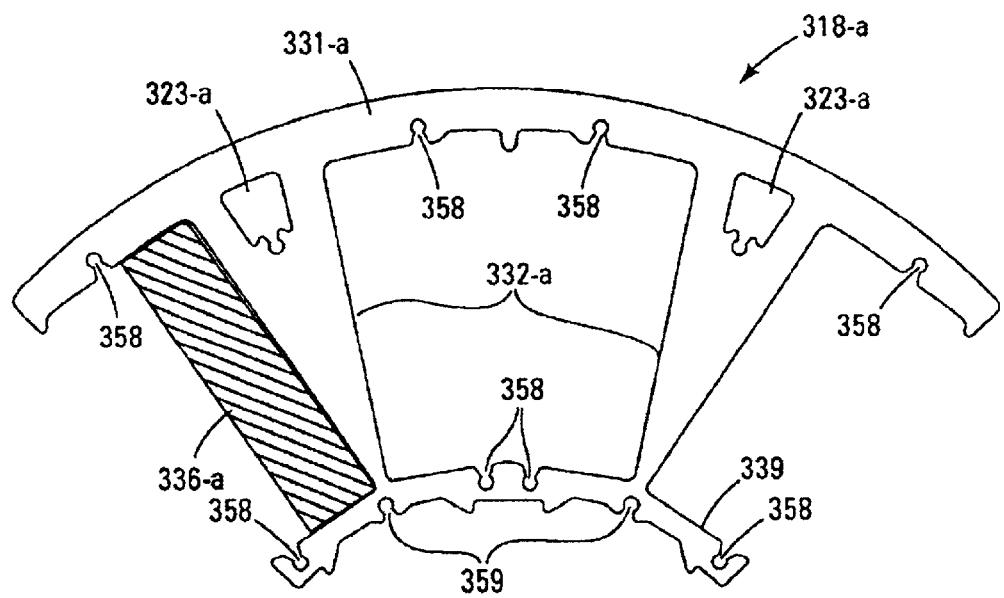
FIG. 3a is an illustration of a top view of one embodiment of a modular card cage according to the teachings of the present invention.

FIG. 3a is an illustration of a top view of one embodiment of a modular card cage, shown generally at 318-a, according to the teachings of the present invention. In one embodiment, card cage 318-a is adapted to couple to up to four electronic cards as depicted by 336-a and provide an isolated heat transfer path for each of the electronic cards. In one embodiment, card cage 318-a is manufactured of a thermally conductive material. In on embodiment, this material is aluminum or the like. In one embodiment, card cage 318-a includes an outer frame member 331-a that is curved to match the shape of the inner wall of an electronics enclosure such as enclosure 200 of FIG. 2. Card cage 318-a further includes an inner frame member 339 which follows the shape of outer frame member 331-a. Card cage 318-a includes support members 332-a that are substantially wedge shaped and are coupled between outer frame member 331-a and inner frame member 339. In one embodiment, each support member 332-a is adapted to couple with up to two electronic cards 336-a.

Outer frame member 331-a is further adapted to couple with an inner wall of an electronics housing as described with respect to FIG. 2 above. In another embodiment, modular card cage 318-a includes only a single support member 332-a adapted to couple with up to two electronics cards 336-a. In one embodiment, each support member 332-a is substantially perpendicular to outer frame member 331-a and inner frame member 339. In one embodiment, each support member 332-a includes an aperture 323-a that runs the length of support members 332-a In one embodiment, aperture 323-a acts as a heat duct and directs heat up and out of the modular card cage 318-a.

In another embodiment, aperture 323-a is filled with a material that is different than the material modular card cage 318-a is manufactured from. For example, in one embodiment, modular card cage 318-a is manufactured from aluminum and aperture 332a is filled with a phase change material, a different type of aluminum or other thermally conductive material.

In one embodiment, modular card cage 318-a includes a plurality of attachment points 358 and 359. In one embodiment, attachment points 359 are adapted to receive fasteners such as a screw, pin or the like for coupling with a spacer (222) as described with respect to FIG. 2 above or other frame structure. In one embodiment, attachment points 358 are adapted to receive fasteners such as a screw, pin or the like for coupling with a device retainer as described below with respect to FIG. 6 below. In one embodiment, attachment points 358 are also grooves that run the length of modular card cage 318-a and are adapted to receive and secure device retainers as described below with respect to FIG. 6.

Figure 3B:
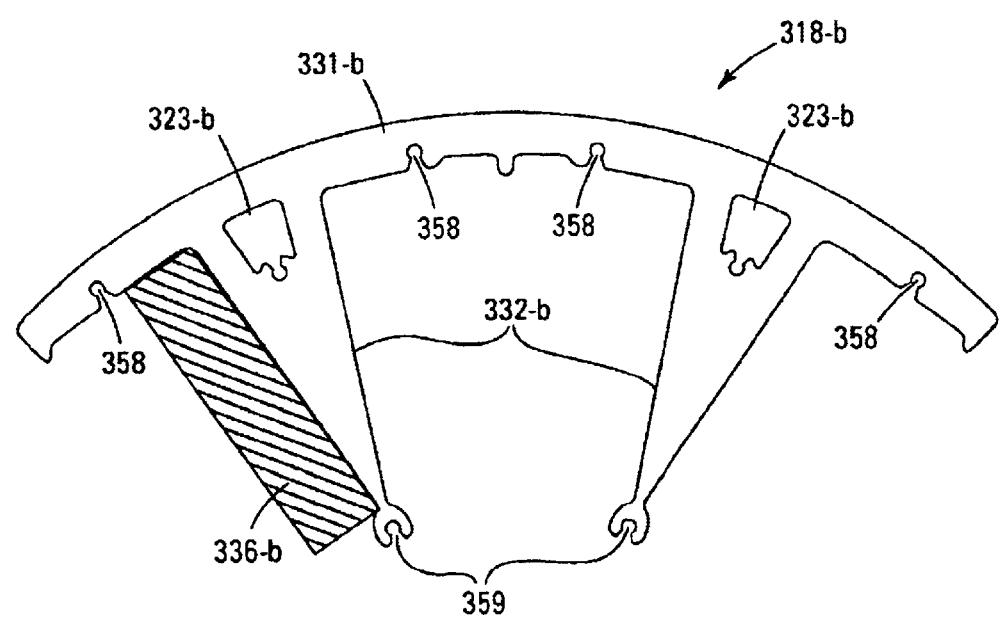
FIG. 3b is an illustration of a top view of another embodiment of a modular card cage according to the teachings of the present invention.

FIG. 3b is an illustration of a top view of another embodiment of a modular card cage, shown generally at 318-b, according to the teachings of the present invention. Card cage 318-b is adapted to couple to up to four electronic cards as depicted by 336-b and provide an isolated heat transfer path for each of the electronic cards. In one embodiment, card cage 318-b is manufactured of a thermally conductive material. In on embodiment, this material is aluminum or the like. In one embodiment, card cage 318-b includes an outer frame member 331-b that is curved to match the shape of the inner wall of an electronics enclosure such as enclosure 200 of FIG. 2. Card cage 318-b includes support members 332-b that are substantially wedge shaped and are coupled to outer frame member 331-b. Each support members 332-b is adapted to couple with up to two electronic cards 336-b.

Outer frame member 331-b is further adapted to couple with an inner wall of an electronics housing as described with respect to FIG. 2 above. In another embodiment, modular card cage 318-b includes only a single support member 332-b adapted to couple with up to two electronics cards 336-b. In one embodiment, each support member 332-b is substantially perpendicular to outer frame member 331-b. In one embodiment, each support member 332-b includes an aperture 323-b as described above with respect to FIG. 3a.

In one embodiment, modular card cage 318-b includes a plurality of attachment points 358 and 359 as described with respect to FIG. 3a above.

Figure 4:
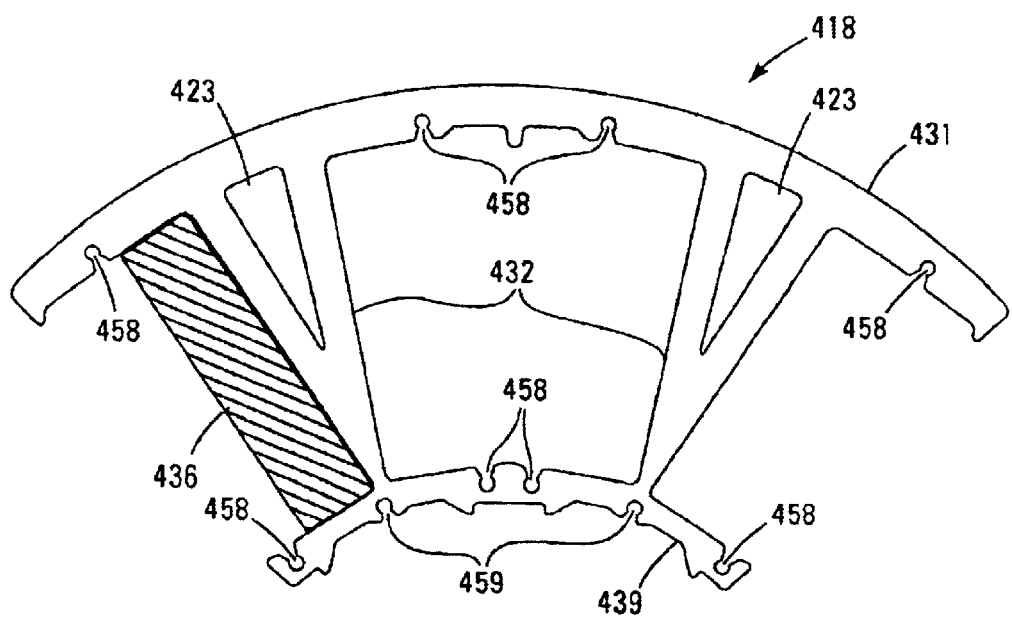
FIG. 4 is an illustration of a top view of one embodiment of a modular card cage according to the teachings of the present invention.

FIG. 4 is an illustration of a top view of one embodiment of a modular card cage, shown generally at 418, according to the teachings of the present invention. Card cage 418 is adapted to couple to up to four electronic cards as depicted by 436 and provide an isolated heat dissipation path for each of the electronic cards. In one embodiment, card cage 418 is manufactured of a thermally conductive material. In on embodiment, this material is aluminum or the like. In one embodiment, card cage 418 includes an outer frame member 431 that is curved to match the shape of the inner wall of an electronics enclosure such as enclosure 200 of FIG. 2. Card cage 418 further includes an inner frame member 439 which follows the shape of outer frame member 431. Card cage 418 includes support members 432 that are substantially wedge shaped and are coupled between outer frame member 431 and inner frame member 439. In one embodiment, each support member 432 is adapted to couple with up to two electronic cards 436.

Outer frame member 431 is further adapted to couple with an inner wall of an electronics housing as described with respect to FIG. 2 above. In another embodiment, modular card cage 418 includes only a single support member 432 adapted to couple with up to two electronics cards 436. In one embodiment, each support member 432 is substantially perpendicular to outer frame member 431 and inner frame member 439. In one embodiment, each support member 432 is hollow and includes an aperture 423 that runs the length of support members 432. In one embodiment, aperture 423 acts as a heat duct and directs heat up and out of the modular card cage 418.

In one embodiment, modular card cage 418 includes a plurality of attachment points 458 and 459. Attachment points 458 and 459 are similar to attachment points 358 and 359 as described above with respect to FIGS. 3a and 3b.

Figure 5:
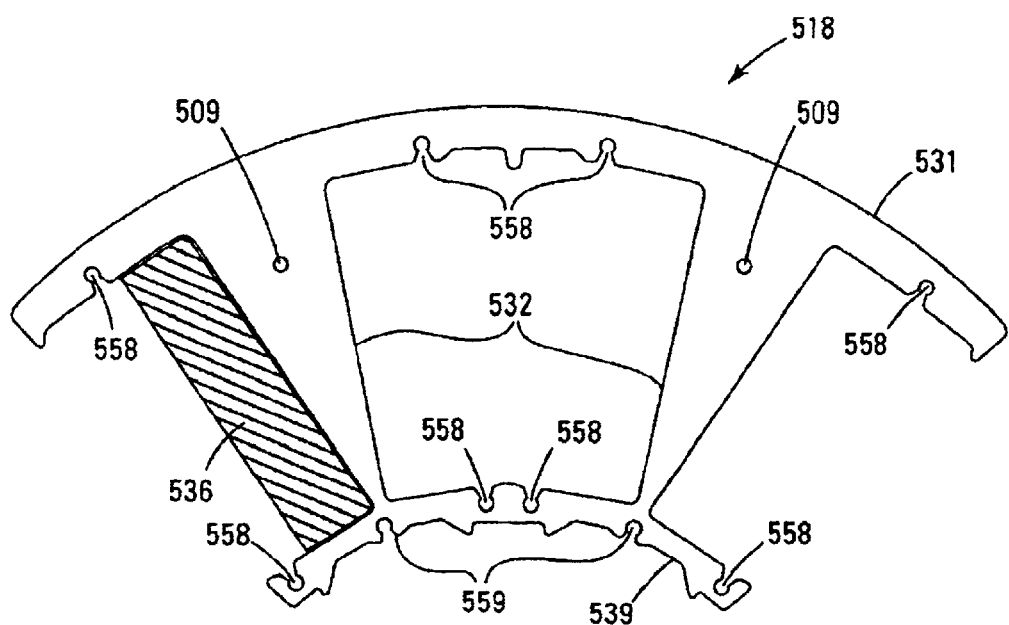
FIG. 5 is an illustration of a top view of one embodiment of a modular card cage according to the teachings of the present invention.

FIG. 5 is an illustration of a top view of one embodiment of a modular card cage, shown generally at 518, according to the teachings of the present invention. Card cage 518 is adapted to couple to up to four electronic cards as depicted by 536 and provide an isolated heat dissipation path for each of the electronic cards. In one embodiment, card cage 318-a is manufactured of a thermally conductive material. In one embodiment, this material is aluminum or the like. In one embodiment, card cage 518 includes an outer frame member 531 that is curved to match the shape of the inner wall of an electronics enclosure such as enclosure 200 of FIG. 2. Card cage 518 further includes an inner frame member 539 that follows the shape of outer frame member 531. Card cage 518 includes support members 532 that are substantially wedge shaped and are coupled between outer frame member 531 and inner frame member 439. In one embodiment, each support member 532 is adapted to couple with up to two electronic cards 536.

Outer frame member 531 is further adapted to couple with an inner wall of an electronics housing as described with respect to FIG. 2 above. In another embodiment, modular card cage 518 includes only a single support member 532 adapted to couple with up to two electronics cards 536. In one embodiment, each support member 532 is substantially perpendicular to outer frame member 531 and inner frame member 539. In this embodiment, each support member 532 is solid. Support members 532 provide isolated heat dissipation paths for each of the electronic cards 536.

In one embodiment, modular card cage 518 includes a plurality of attachment points 558 and 559. Attachment points 558 and 559 are similar to attachment points 358 and 359 as described above with respect to FIGS. 3a and 3b.

It is understood that although modular card cages 318-a, 318-b, 418 and 518 are shown with 2 support members and adapted to couple to 4 electronic cards the modular card cages may be any size, include any number of support members and be adapted to couple to any number of electronic cards. For example, currently 4 modular card cages are designed to fit within an electronics enclosure but the modular card cages designed to fit within an electronics enclosure could be one or more.

Figure 6A:
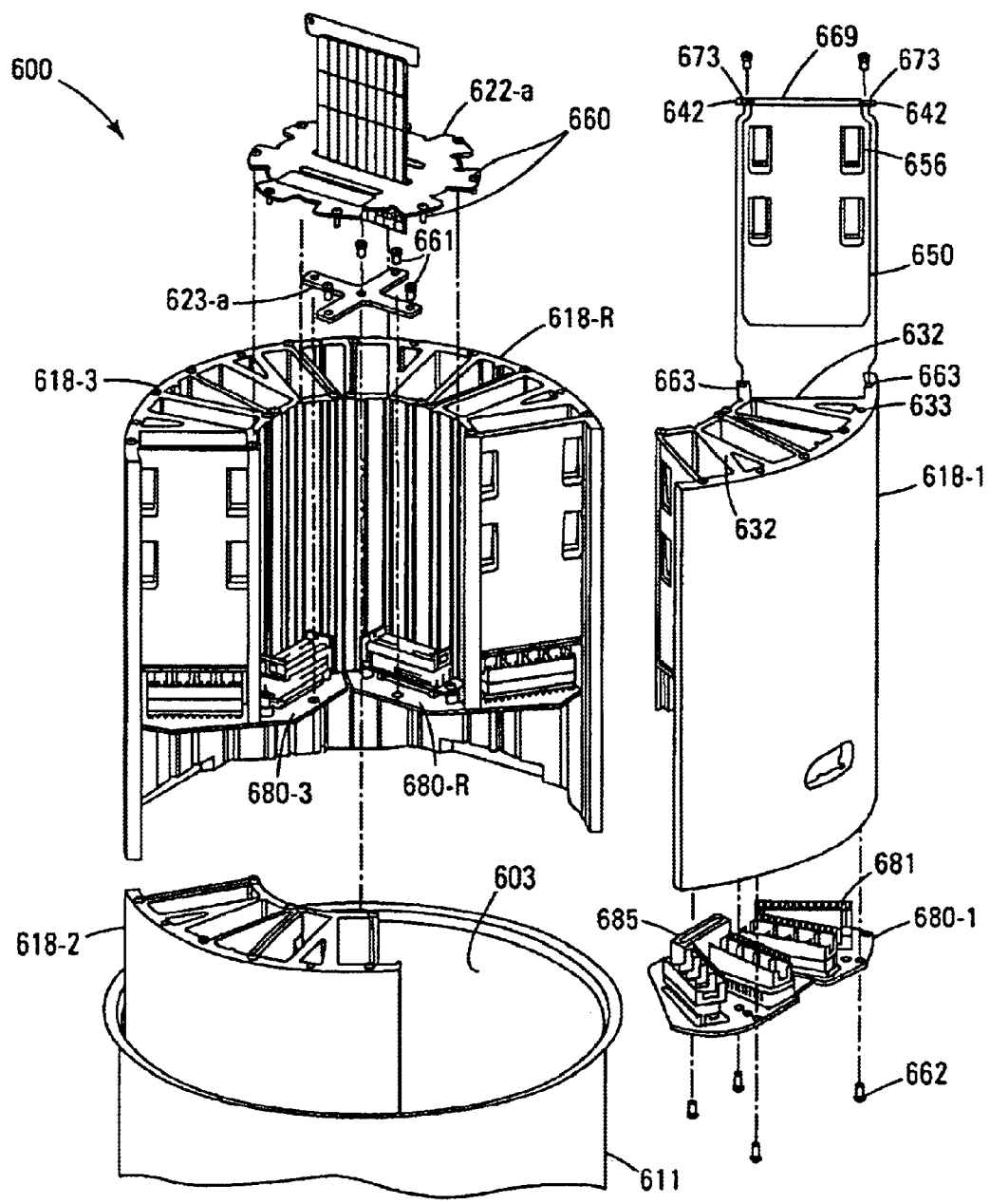
FIG. 6a is an illustration of one embodiment of an electronic equipment enclosure including modular card cages and electronic device retainers according to the teachings of the present invention.

FIG. 6a is an illustration of one embodiment of an electronic equipment enclosure including modular card cages and electronic device retainers, shown generally at 600, according to the teachings of the present invention. Efficient heat dissipation requires consistent and preferably direct contact between materials, e.g., electronic cards, card cages, and enclosures. Embodiments of the present invention provide systems and methods to get and keep electronics cards in contact with modular card cages 618. If good contact is not maintained poor heat dissipation results and the rate of failure for the electronic devices is high. Active compression devices such as cams require a technician or user to engage the device. The active compression devices are prone to failure and are often overlooked by technicians. Additionally, electronic cards come in many different styles and contact with heat dissipation members do not take into consider open frame repeaters where the repeaters are encased in a box or frame with a portion of the sides removed.

Enclosure 600 includes a cylindrical body 611 including multiple modular card cages 618-1 to 618-R and multiple printed circuit boards 680-1 to 680-R. Each printed circuit board 680 includes a plurality of connector blocks 681. Each connector block 681 is adapted to receive one electronics card such as repeater 236 discussed with respect to FIG. 2 above. Each printed circuit board 680 further includes a single connector 685 adapted to receive transmissions to/from a cable. In one embodiment, connector 685 is a champ connector. In this embodiment, the need for wire wrapping is eliminated. In one embodiment, connector blocks 681 have been redesigned to include surge protection. This reduces the number of connectors for each circuit board 680 and the footprint of each printed circuit board 680. Each printed circuit board 680 is adapted to couple to a respective modular card cage 618 via one or more fasteners 662. Fasteners 662 include screws, clamps, rivets, pins or the like.

Each modular card cage 618 is adapted to couple with up to four electronics cards. Isolated heat dissipation paths for energy produced by each electronics card to exit electronic equipment enclosure 600 are created through the combination of modular card cage 618 and wall 603 of cylindrical body 611. In this embodiment, there are shown 4 modular card cages 618 each providing isolated heat dissipation paths for up to 4 electronic cards. The modular card cages 618 each provide direct isolated heat dissipation paths for the energy from each of the electronic cards to be extracted from the enclosure environment to the ambient air.

In one embodiment, each modular card cage 618 is adapted to be held in direct contact with wall 603 via a first and second spacer 622-a and 623-a, respectively. First spacer 622-a is adapted to couple to each modular card cage 618 via one or more fasteners 660 and force modular card cages 618 into contact with wall 603. Second spacer 623-a is adapted to couple to each printed circuit board 680 via one or more fasteners 661 and force modular card cages 618 into contact with wall 603. Fasteners 660 and 661 include screws, clamps, rivets, pins or the like.

Contact between electronic cards and modular card cages 618 is accomplished by providing electronic device retainers 650 to engage with the electronic device. In this embodiment, for each modular card cage 618, 4 device retainers 650 are required for up to 4 electronic cards. In one embodiment, each device retainer 650 is adapted to engage with grooves 663 of a modular card cage such as modular card cage 618-1. In one embodiment, grooves 663 are also used to secure device retainer 650 to modular card cage 618. In one embodiment, device retainer 650 includes a top edge 669. In one embodiment, top edge 669 includes extension tabs 642 that catch the upper surface 633 of modular card cage 618. Extension tabs 642 each provide a slot or hole 673 to receive a fastener that is adapted to engage with grooves 663 and secure device retainer 650 in place.

Once emplaced, device retainer 650 provides consistent contact between electronics cards and modular card cage 618. In one embodiment, device retainer 650 is made out of a flexible and resilient material such as spring steel or the like. In this embodiment, compression retainer 650 includes multiple pressure protrusions 656. Protrusions 656 are adapted to push and hold electronic cards into contact with support members 632 of modular card cages 618.

There are many different types of electronics cards for use with this device retainer 650. Pressure protrusions 656 may be aligned on device retainer 650 to provide the best contact between an electronics card and support member 632 of card cage 618. In one embodiment, pressure protrusions 656 are placed as close to each edge of device retainer 650 to engage with the electronics device. For example in one embodiment, electronic cards are designed with a hollow frame surrounding the repeater electronics. In another embodiment, pressure protrusions 656 are placed device retainer 650 to provide even pressure contact between an electronic card and support member 632 of card cage 618.

Figure 6B:
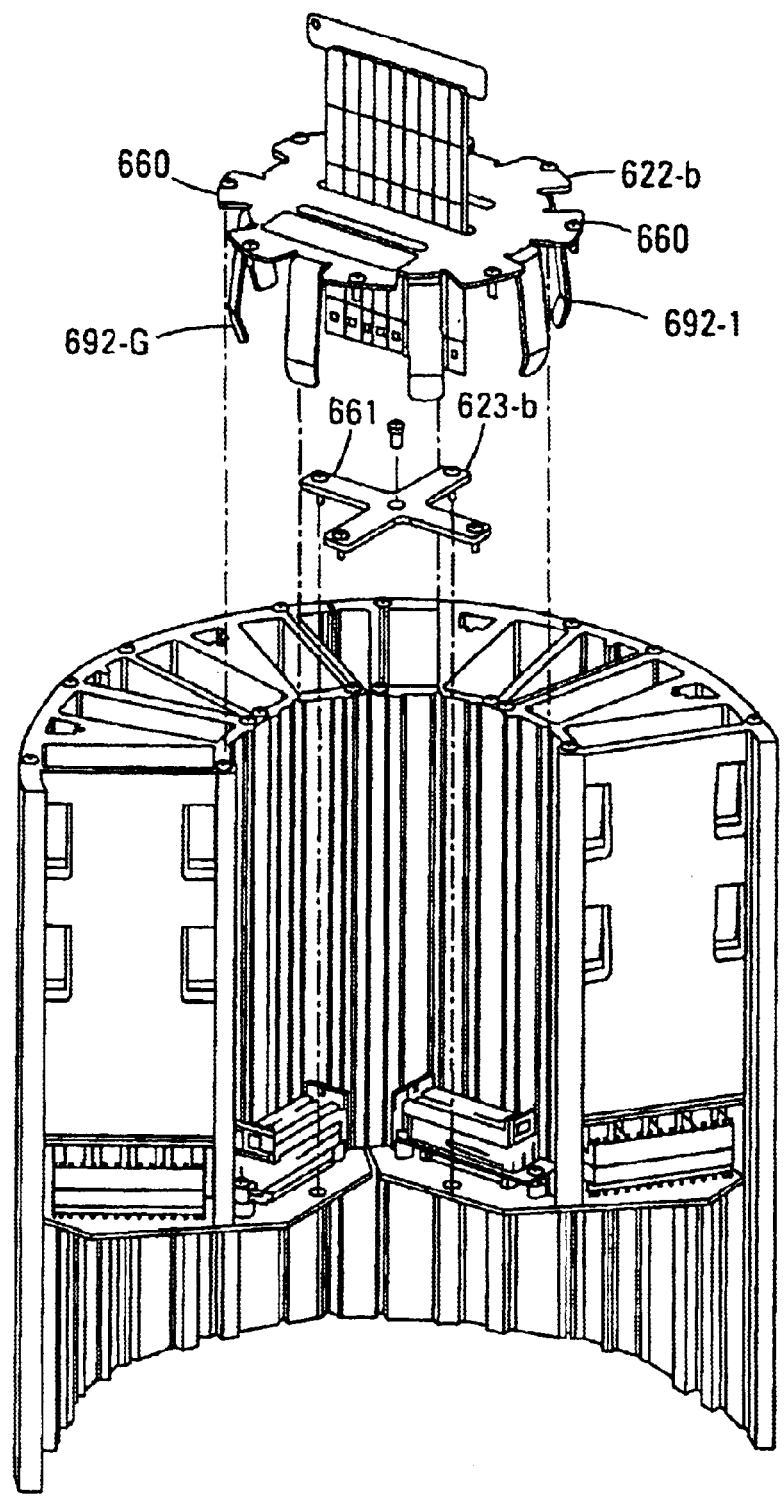
FIG. 6b is an illustration of another embodiment of a spacer according to the teachings of the present invention.

FIG. 6b is an illustration of another embodiment of a spacer 622-b. In this embodiment, each modular card cage 618 as discussed with respect to FIG. 6a is adapted to be held in direct contact with wall 603 via a first and second spacer 622-b and 623-b, respectively. First spacer 622-b is adapted to couple to each modular card cage 618 via one or more fasteners 660 and force modular card cages 618 into contact with wall 603. First spacer 622-b includes one or more fingers 692-1 to 692-G. Each finger 692 is adapted to push modular card cages 618 into contact with wall 603. In one embodiment, spacer 622-b including fingers 692 are made from spring steel or the like. In one embodiment, fingers 692 are made of a material that has memory. In one embodiment, spacer 622-b is pressed into place inside of modular card cages 618 and fits snuggly in place to provide pressure on modular card cages 618. In one embodiment, spacer 622-b includes eight fingers 692. Second spacer 623-b is adapted to couple to each printed circuit board 680 via one or more fasteners 661 and force modular card cages 618 into contact with wall 603. Fasteners 660 and 661 include screws, clamps, rivets, pins or the like.

Figure 7:
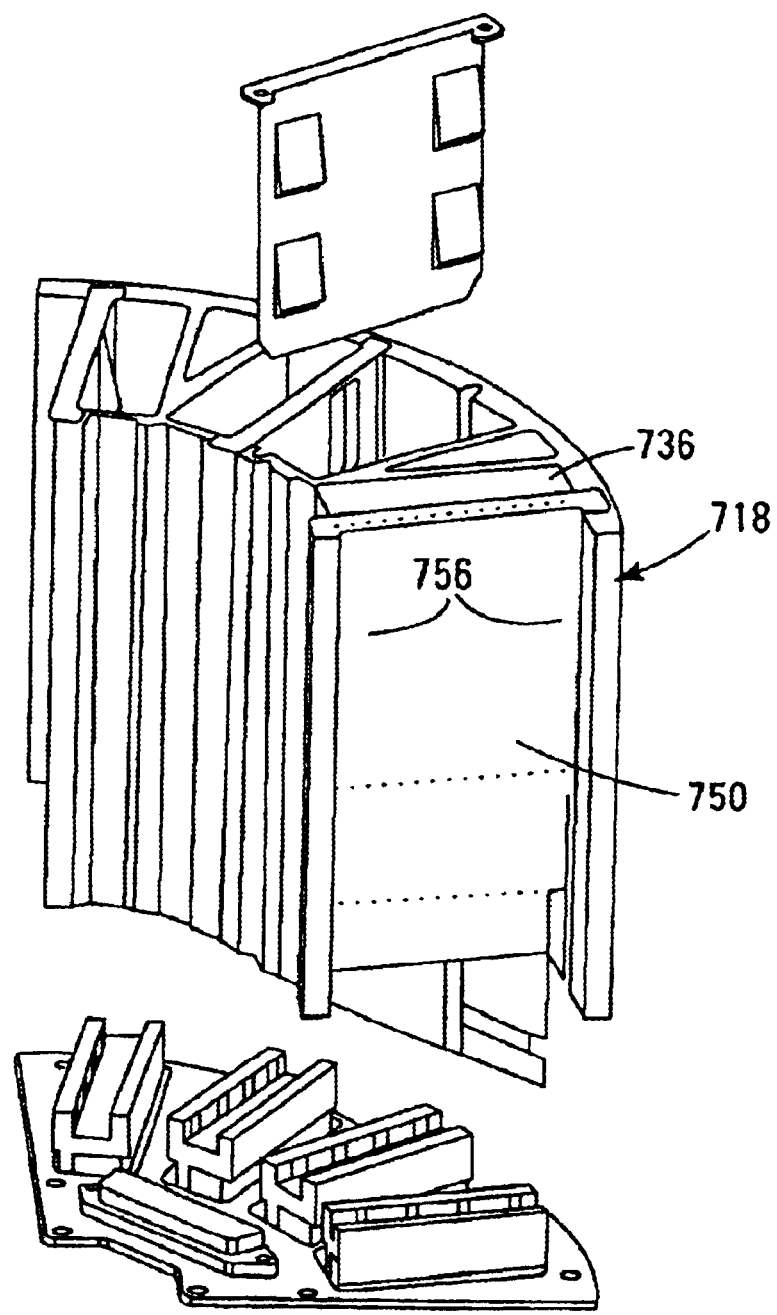
FIG. 7 is an isometric view of one embodiment of a modular card cage according to the teachings of the present invention.

FIG. 7 is an isometric view of one embodiment of a modular card cage 718 according to the teachings of the present invention. In this embodiment, a device retainer 750 is shown engaged with an electronics card 736. In this embodiment, device retainer 750 is engaged with electronic cards 736 and presses electronic card 736 into contact with support member 732 of card cage 718. Device retainer 750 secures each electronic card 736 into a slot defined by the engagement of modular card cage 718 and device retainer 750. Once device retainer 750 is emplaced, a slot for receiving electronic card 736 is defined. In one embodiment, electronic card 736 is removed by releasing device retainer 750.

Electronics cards are susceptible to vibration and gravity. Cards are often retained only by an electrical connection such as insertion into an electrical socket. Due to vibration during shipping and operation the cards can become loose and dislodged from the electrical connectors. The cards can also be loosened when subjected to mounting locations that force the electronic cards to "hang" from the electrical socket. The use of active retention devices require human intervention and are not reliable. Loose connections cause operation errors and result in time consuming and costly service calls. Device retainers 750 aid in solving these problems by engaging with modular card cages 718 to provide card guides for the insertion of electronic circuit cards such as electronic card 736. Device retainer 750 keeps a positive pressure on electronic card 736 and provides consistent contact between the electronic card 736 and modular card cage 718. It is understood that device retainer 736 may be made of any size or shape to suit the type of electronic card 736 and include any number of pressure protrusions 756. As a result electronic card 736 is held in direct thermal contact with card cage 718. Device retainer 750 aids in providing direct isolated heat dissipation paths from the electronic card 73;6 to the exterior of the enclosure, such as enclosure 600 of FIG. 6 above.

Embodiments of the present invention reduce the overall weight of electronics enclosures by replacing single structure card cages with modular card cages. Embodiments of the present invention simplify the manufacturing and assembly of electronic housings. The modular card cages reduce weight and parts in manufacturing as well as allow for independent and fixed compression devices to retain the electronic cards. Embodiments of the present invention provide an environmental and pressure seal to protect and maintain the electronics enclosure as well as allowing field replaceable heat sinks without breaking a seal.

FIG. 8a is an illustration of one embodiment of a strain relief for an electronics enclosure, shown generally at 800, according to the present invention. The illustration includes a portion of an electronics enclosure 811 having a mounting structure 881. A strain relief device 899 is shown in an assembled view and includes a 2 part structure having a first member 895 and a second member 896 that mate together to provide strain relief for cable stub 807.

In operations strain relief 899-a enables the equipment enclosure 811 to be lifted using cable stub 807 without unseating the cable stub 807 from the base of electronics enclosure 811. As a result equipment enclosure 811 does not require cable stub 807 to be fully potted into the base 815 of enclosure 811. This enables the cables such as cable stub 807 and enclosures such as 811 to be manufactured separately and be fully modular.

FIG. 8b is an illustration of one embodiment of an assembled strain relief 899 according to the present invention. The assembled strain relief 899 includes first member 895 and second member 896 as shown in FIG. 8a.

Figure 9:
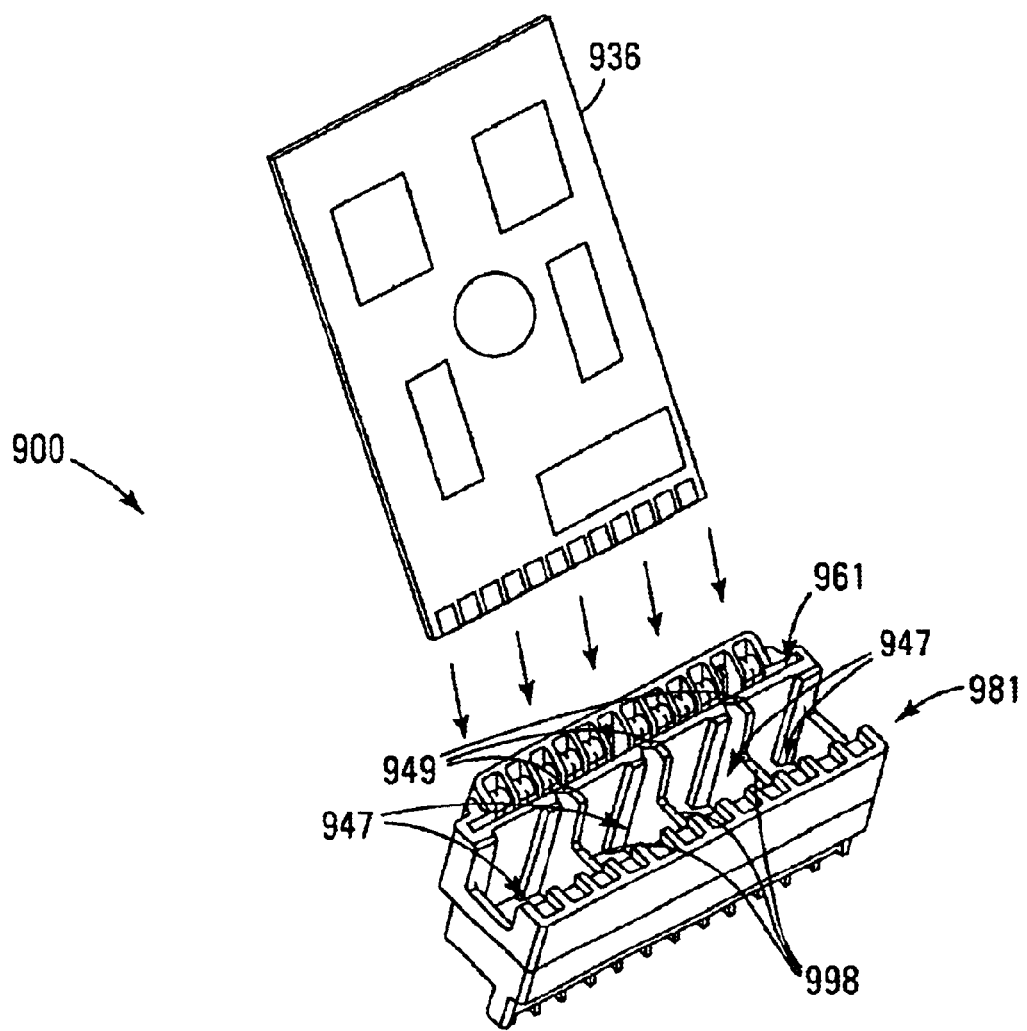
FIG. 9 is an illustration of a connector block and electronics card according to the present invention.

FIG. 9 is an illustration of a connector block and electronics card, shown generally at 900, according to the present invention. Connector block 981 has been designed to be smaller in size yet include surge protection. In one embodiment, connector block 981 is approximately 2.30" in length and 0.90" wide approximately 40% smaller than previous designs. Connector block 981 includes a plurality of fuse sockets 947 and a slot 961 adapted to receive an edge of electronics card 936. Slot 961 has been lengthened to enable receipt of a variety of manufacturer's electronics cards. In operation, electronics card 936 is inserted into a slot formed by a device retainer and modular card cage as described with respect to FIG. 7 above and is received by connector block slot 961. In contrast to previous designs, when electronics card 936 is inserted incorrectly the size of the slot formed by the device retainer and modular card cage along with the location of connector block 981 on a printed circuit board will prohibit the electronics card from being inserted into connector block slot 961. This acts as a safety device and protects the electronics on card 936.

In addition, in one embodiment, connector block 981 includes a plurality of eased edges 949 that act as a keying feature and guides the electronics card 936 into connector block slot 961. The eased edges 949 aid in the assembly of the electronics equipment enclosure. Further, connector block 981 includes a plurality of spines 998 that separate each fuse sockets 947. Spines 998 also aid in prohibiting electronics card 936 from being inserted into fuse sockets 947. Spines 998 stop the edge of electronics card 936.

Figure 10:
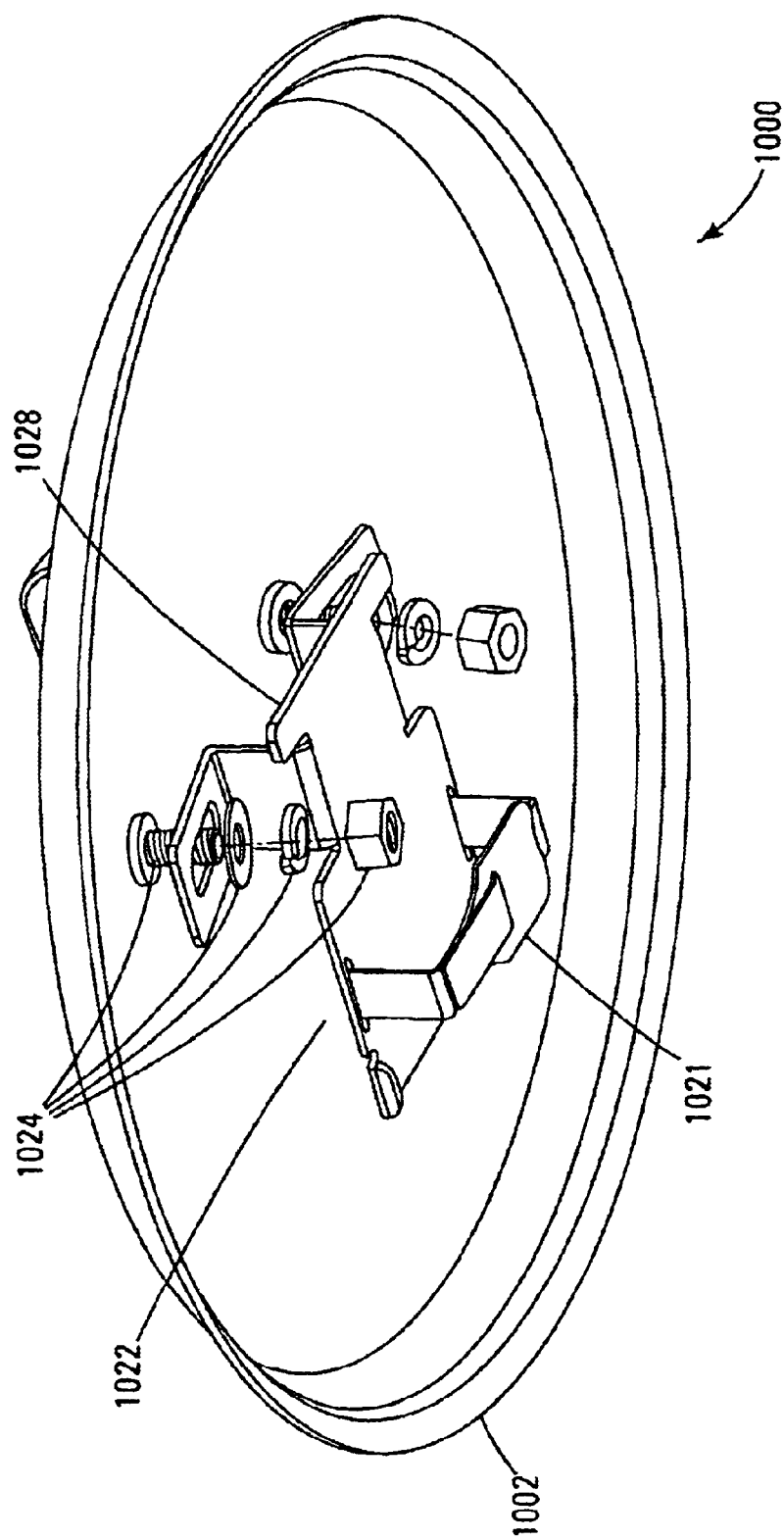
FIG. 10 is an illustration of a lid storage system according to the teachings of the present invention.

FIG. 10 is an illustration of a lid storage system, shown generally at 1002, according to the teachings of the present invention. Lid storage system 1000 includes a lid 1002 for an equipment enclosure such as 100 described with respect to FIG. 1. System 1000 further includes a holder 1028 for tools or equipment to be stored within an equipment enclosure. The tools or equipment may include one or more of a test card, fuse tool, spare fuses, desiccant, or the like. Holder 1028 is secured to lid 1002 via fasteners 1024. Fasteners 1024 include one or more of screws, fastener assemblies (nuts, bolts, and washers), pins rivets or the like. Holder 1028 further includes a retention strap 1021 to secure the tools or equipment in place and protect them from vibration and loss. In one embodiment, retention strap 1021 is made from hook and pile material. In one embodiment, lid 1002 is dome shaped and reduces corrosion by shedding moisture on the outside. By being dome shaped, lid 1002 also reduces dripping of moisture onto electronics on the inside by encouraging the moisture to run toward the edge of the lid on the inside.

What is claimed is:

1. An electronics enclosure, comprising:
   a cylindrical body; and
   one or more modular card cages, adapted to receive one or more electronic circuit cards, including:
      an outer frame member in contact with an inner wall of the cylindrical body sufficient to dissipate unwanted heat;
      an inner frame member;
      one or more support members coupled between the outer frame member and the inner frame member; and
      a plurality of electronic device retainers adapted to couple to the modular card cage and hold each of the one or more electronic circuit cards in contact with one of the one or more support members;
   wherein the support members provide an isolated heat dissipation path for heat, produced by each of the one or more electronic circuit cards, to be removed from the enclosure.

2. The enclosure of claim 1, wherein the one or more support members comprise one or more wedge shaped support members.

3. The enclosure of claim 2, wherein the one or more wedge shaped support members is hollow.

4. The enclosure of claim 2, wherein the one or more wedge shaped support members is solid.

5. The enclosure of claim 1, wherein each of the one or more support members is adapted to couple to up to two electronic circuit cards.

6. The enclosure of claim 1, wherein the cylindrical body and the one or more modular card cages are fabricated of a thermally conductive material.

7. The enclosure of claim 1, further comprising one or more spacers adapted to couple to each of the one or more modular card cages and aid in maintaining each of the one or more modular card cages in direct contact with an inner wall of the cylindrical body.

8. The enclosure of claim 7, wherein one of the one or more spaces includes a plurality of fingers that extend downward and outwardly from an upper surface of the one spacer and wherein each of the plurality of fingers engages with one of the one or more modular card cages.

9. An electronics enclosure, comprising:
   a cylindrical body;
   one or more modular card cages, adapted to receive one or more electronic circuit cards, including:
      an outer frame member in thermal contact with an inner wall of the cylindrical body sufficient to dissipate unwanted heat;
      an inner frame member;
      one or more support members coupled between the outer frame member and the inner frame member; and
      a plurality of electronic device retainers adapted to couple to the modular card cage and hold each of the one or more electronic circuit cards in thermal contact with one of the one or more support members;
   wherein the support members provide an isolated heat dissipation path for heat, produced by each of the one or more electronic circuit cards, to be removed from the enclosure; and
   one or more printed circuit boards adapted to couple to each of the one or more modular card cages;

wherein each printed circuit board includes one or more connector blocks and a single champ connector;

wherein the one or more connector blocks are each adapted to receive one of the one or more electronic circuit cards.

10. The enclosure of claim 9, wherein the one or more support members comprise one or more wedge shaped support members.

11. The enclosure of claim 10, wherein the one or more wedge shaped support members is hollow.

12. The enclosure of claim 10, wherein the one or more wedge shaped support members is solid.

13. The enclosure of claim 9, wherein each of the one or more support members is adapted to couple to up to two electronic circuit cards.

14. The enclosure of claim 9, wherein the cylindrical body and the one or more modular card cages are fabricated of a thermally conductive material.

15. The enclosure of claim 9, wherein the electronic circuit cards comprise single wide repeaters.

16. The enclosure of claim 9, wherein the electronic circuit cards comprise double wide repeaters.

17. The enclosure of claim 9, wherein the one or more connector blocks each include a keying feature that aids in prohibiting the electronic circuit cards from being inserted incorrectly.

18. The enclosure of claim 9, wherein the one or more connector blocks each include surge protection.

19. The enclosure of claim 9, further comprising one or more spacers adapted to couple to each of the one or more modular card cages and aid in maintaining each of the one or more modular card cages in direct contact with the inner wall of the cylindrical body.

20. The enclosure of claim 19, wherein a first space of the one or more spaces includes a plurality of fingers that extend downward and outwardly from an upper surface of the first spacer and wherein each of the plurality of fingers engages with one of the one or more modular card cages.

21. The enclosure of claim 19, wherein a second spacer of the one or more spaces is adapted to couple to each of the one or more printed circuit boards.

22. An electronics enclosure, comprising:

a cylindrical body having a top opening and a base;

at least one lid adapted to couple to the cylindrical body to form a seal from the environment and against a pressure differential;

a plurality of modular card cages, each card cage adapted to receive one or more electronic circuit cards and including:

a curved outer frame member;

a curved inner frame member;

one or more wedged support members coupled between the outer frame member and the inner frame member; and one or more electronic device retainers adapted to couple to the modular card cage and form a slot to receive and hold the one or more electronic circuit cards in direct physical and thermal contact with the one or more wedged support members;

wherein the modular card cage is fabricated of a thermally conductive material;

wherein energy produced by the one or more electronic circuit cards is directed out of the electronics enclosure via isolated heat dissipation paths;

wherein the length of each isolated heat dissipation path from the one or more electronics circuit cards to air ambient to the electronics enclosure is substantially equivalent.

23. The enclosure of claim 22, wherein the at least one lid includes a storage system having a holder for tools and equipment.

24. The enclosure of claim 23, wherein the holder includes a retention strap to secure the tools and equipment in place.

25. The enclosure of claim 22, wherein the lid is dome shaped.

26. The enclosure of claim 22, further including a mounting bracket coupled to the cylindrical body.

27. The enclosure of claim 26, wherein the mounting bracket includes a strain relief structure adapted to couple to a stub cable receivable by the cylindrical body and provide strain relief for the stub cable.

28. A modular card cage adapted to couple to one or more electronic circuit cards, comprising:

a curved outer frame member;

a curved inner frame member;

one or more wedged support members coupled between the outer frame member and the inner frame member; and one or more electronic device retainers adapted to couple to the modular card cage and form a slot to receive and hold one of the one or more electronic circuit cards in direct physical contact with one of the one or more wedged support members;

wherein the modular card cage provides an isolated heat dissipation path for heat produced by each of the one or more electronic circuit cards.

29. The modular card cage of claim 28, wherein the one or more wedged support members are hollow.

30. The modular card cage of claim 28, wherein the one or more wedged support members are solid.

31. The modular card cage of claim 28, wherein each of the one or more wedged support members is adapted to couple to up to two electronic circuit cards.

32. The modular card cage of claim 28, wherein the one or more modular card cages are fabricated of a thermally conductive material.

33. The modular card cage of claim 28, wherein the electronic circuit cards comprise single wide repeaters.

34. The modular card cage of claim 28, wherein the electronic circuit cards comprise double wide repeaters.

35. The modular card cage of claim 28, wherein the one or more electronic device retainers are fabricated of a flexible and resilient material.

36. The modular card cage of claim 35, wherein the flexible and resilient material is spring steel.

37. The modular card cage of claim 28, wherein the one or more electronic device retainers each include a plurality of pressure protrusions that aid in holding the electronic circuit cards in direct physical and thermal contact with the one of the one or more wedged support members.

38. An enclosure comprising:

a plurality of modular card cages adapted to dissipate energy from one or more electronic cards via a cylindrical body of the enclosure, wherein the plurality of modular card cages and the cylindrical body are fabricated of a thermally conductive material;

an electronic device retainer adapted to couple to each of the plurality of card cages and form a slot that is adapted to receive one of the electronic cards, wherein the device retainer forces the electronic card into contact with a support member of the card cage; and wherein each of the plurality of card cages provides an isolated heat dissipation path from each of the one or more electronic cards to the exterior of the enclosure.

39. The enclosure of claim 38, wherein the electronic device retainer includes a plurality of pressure protrusions that aid in holding the electronic card in direct physical and thermal contact with the support members.

40. The enclosure of claim 38, wherein the electronic device retainer is fabricated of spring steel.

41. A method of extracting heat from a sealed electronics equipment enclosure, comprising:

moving energy produced by one or more electronic cards, enclosed within the electronics equipment enclosure, to the exterior of the enclosure via a modular card cage;

wherein the modular card cage is comprised of a plurality of support members and the one or more electronics cards are each in contact with one of the plurality of support members; and dissipating the energy to air ambient to the electronics equipment enclosure via the modular card cage.

42. The method of claim 41, further comprising engaging a device retainer with the modular card cage and forcing the one or more electronics cards in contact with one of the plurality of support members.

43. An enclosure, comprising:

a plurality of modular card cages; and a plurality of device retainers, wherein each device retainer is adapted to couple to one of the plurality of modular card cages and form a slot that is adapted to receive and electronic circuit card;

wherein the device retainer further forces the electronic circuit card in contact with the support member and hold the electronic circuit card in place.

44. The enclosure of claim 43, wherein the device retainer includes a plurality of pressure protrusions adapted to engage with and assist in holding each electronic circuit card in contact with a support member of one of the plurality of modular card cages.

45. The enclosure of claim 43, wherein the device retainer mates with one or more groves formed in one of the plurality of modular card cages.

46. A method of creating an isolated heat dissipation path, comprising:

thermally contacting one or more electronic circuit cards with a wedged support member of a modular card cage, wherein the modular card cage includes a curved outer member coupled to a curved inner member via the wedged support member;

wherein the wedged support member is substantially perpendicular to both the inner and outer curved members;

encasing the modular card cage within an electronics enclosure;

forcing the modular card cage into thermal and physical contact with an inner wall of the electronics enclosure; and drawing energy from the one or more electronic cards to the exterior of the electronics enclosure via the modular card cage.

47. A method of manufacturing an electronics enclosure, comprising:

forming a modular card cage adapted to receive one or more electronic circuit cards, wherein the modular card cages includes:

a curved outer frame member;

a curved inner frame member; and one or more wedged support members coupled between the outer frame member and the inner frame member;

forming one or more electronic device retainers adapted to couple to the modular card cage and form a slot to receive and hold one of the one or more electronic circuit cards in direct physical and thermal contact with one of the one or more wedged support members; and forming one or more pressure protrusions in the electronic device retainers that are adapted to engage with and force one of the one or more electronic circuit cards in contact with one of the one or more wedged support members.

48. A repeater housing, comprising:

a plurality of modular card cages adapted to couple with one or more repeaters, wherein each modular card cage includes:

a curved outer frame member;

a curved inner frame member;

one or more wedged support members coupled between the outer frame member and the inner frame member; and one or more electronic device retainers adapted to couple to the modular card cage and form a slot to receive and hold the one or more repeaters in direct physical and thermal contact with the one or more wedged support members;

wherein the modular card cage is fabricated of a thermally conductive material;

wherein energy produced by the one or more repeaters is directed out of the repeater housing via isolated heat dissipation paths created by the plurality of modular card cages.

49. The repeater housing of claim 48, wherein the one or more wedged support members are hollow.

50. The repeater housing of claim 48, wherein the one or more wedged support members are solid.

51. The repeater housing of claim 48, wherein each of the one or more wedged support member is adapted to couple to up to two repeaters.

52. The repeater housing of claim 48, wherein the one or more repeaters are single wide repeaters.

53. The repeater housing of claim 48, wherein the one or more repeaters are double wide repeaters.

54. The repeater housing of claim 48, wherein the one or more electronic device retainers each include a plurality of pressure protrusions that aid in holding the repeaters in direct physical and thermal contact with the one of the one or more wedged support members.

* * * * *